United States Patent [19]

Chen et al.

[11] Patent Number: 5,150,083

[45] Date of Patent: Sep. 22, 1992

[54] DIGITALLY CONTROLLED MONOLITHIC SWITCH MATRIX USING SELECTABLE DUAL GATE FET POWER DIVIDERS AND COMBINERS

[75] Inventors: Tzu H. Chen, East Brunswick; Mahesh Kumar, Lawrenceville, both of N.J.

[73] Assignee: Siemens Aktiengesellschaft, Berlin and Munich, Fed. Rep. of Germany

[21] Appl. No.: 565,877

[22] Filed: Aug. 9, 1990

Related U.S. Application Data

[63] Continuation of Ser. No. 255,092, Oct. 7, 1988, abandoned.

[51] Int. Cl.$^5$ .............................................. H04Q 1/00
[52] U.S. Cl. ................................ 333/103; 340/825.91; 379/292; 307/571
[58] Field of Search ............... 333/103, 104, 101, 262; 379/292; 340/825.79, 825.89, 825.9, 825.91; 307/571, 584

[56] References Cited

U.S. PATENT DOCUMENTS

| | | | |
|---|---|---|---|
| 3,833,866 | 9/1974 | Boutelant | 333/103 X |
| 4,399,439 | 8/1983 | Upadhyayula | 333/101 X |
| 4,472,691 | 9/1984 | Kumar et al. | 333/103 |
| 4,511,813 | 4/1985 | Pan | 333/103 X |
| 4,580,114 | 4/1986 | Upadhyayula | 307/571 X |
| 4,609,889 | 9/1986 | Kumar | 333/100 |
| 4,611,184 | 9/1986 | Kumar | 333/100 |
| 4,682,127 | 7/1987 | Magarshack | 333/103 |
| 4,731,594 | 3/1988 | Kumar | 333/103 |
| 4,810,911 | 3/1989 | Noguchi | 307/571 |

FOREIGN PATENT DOCUMENTS 204312 11/1984 Japan ................................. 333/103

OTHER PUBLICATIONS

GaAs IC Applications in Electronics Warfare, Radar and Comm. Systems, D. G. Fisher, Microwave Journal, May 1988, pp. 275-292.
Broadband MMIC's For System Applications, R. W. Bierig et al., Microwave Journal, May 1988, pp. 251-270.

Primary Examiner—Eugene R. Laroche
Assistant Examiner—Benny T. Lee
Attorney, Agent, or Firm—Joseph S. Codispoti

[57] ABSTRACT

There is described a 2×2 switch matrix which includes four 1×1 switch matrix modules. Each 1×1 switch matrix module consists of an active power divider switch (APDS), an active power combiner switch (APCS) and an air bridge crossover. Additional APDSs and APCSs are utilized in the matrix to compensate for path length differences between different input to output signal paths thus providing good phase and amplitude tracking. The basic switch matrix modules are utilized to form a 2×2 switch matrix whereby two primary input ports can be connected to any one of two primary output ports. The 2×2 switch matrix is utilized to formulate larger matrix arrays as N×M configuration. Each of the active power divider switches and power combiner switches utilize two separate dual gate FETs which are suitably interconnected, depending upon whether the circuit is to be used as a power combiner or power divider. The other gate electrodes of the dual gate FETs are used as control terminals to receive an adequate bias voltage to therefore determine the power distribution or power combination characteristics of each of the devices and hence to control the coupling between input and output terminals.

11 Claims, 8 Drawing Sheets

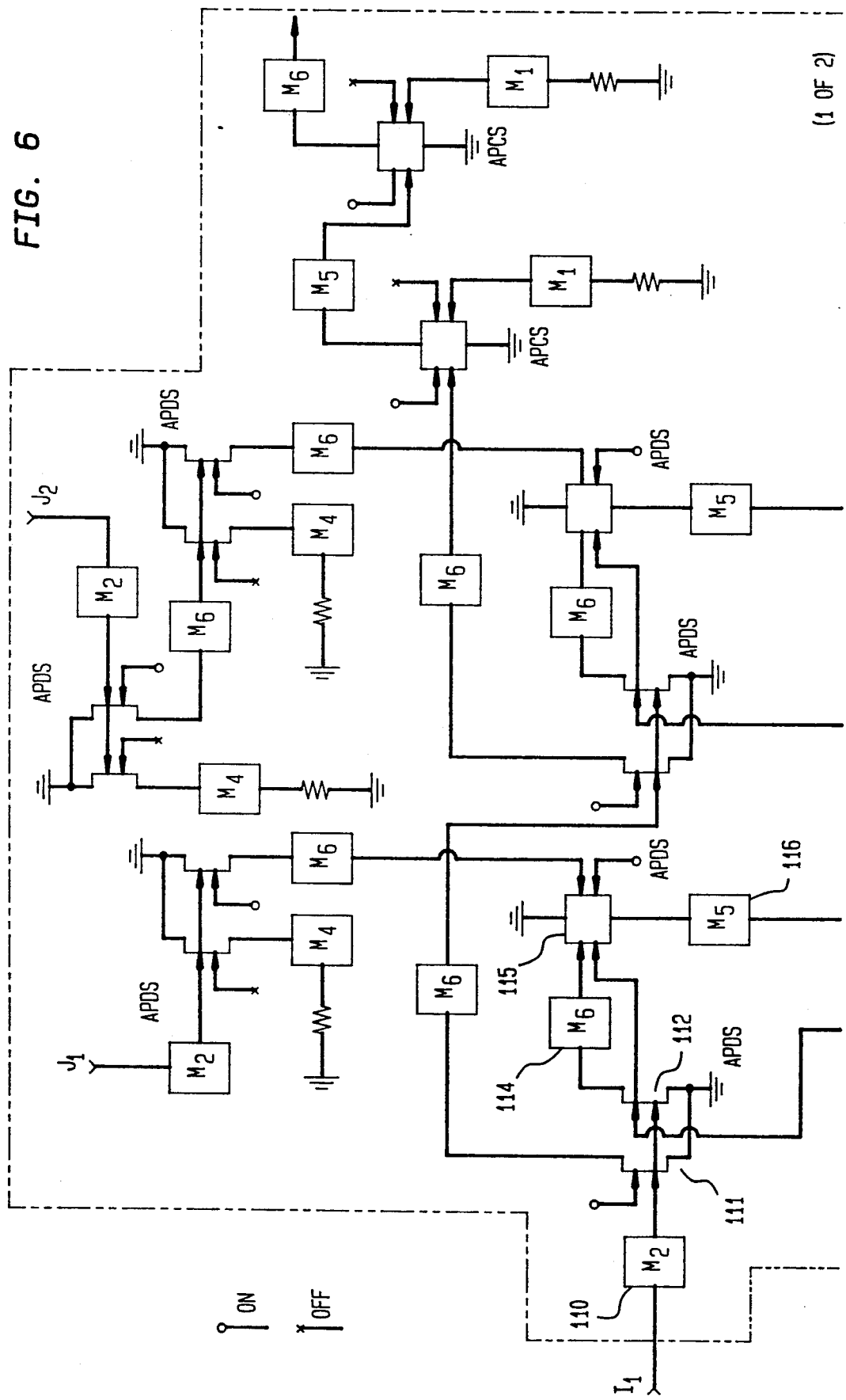
FIG. 6 (1 OF 2)

(2 OF 2)

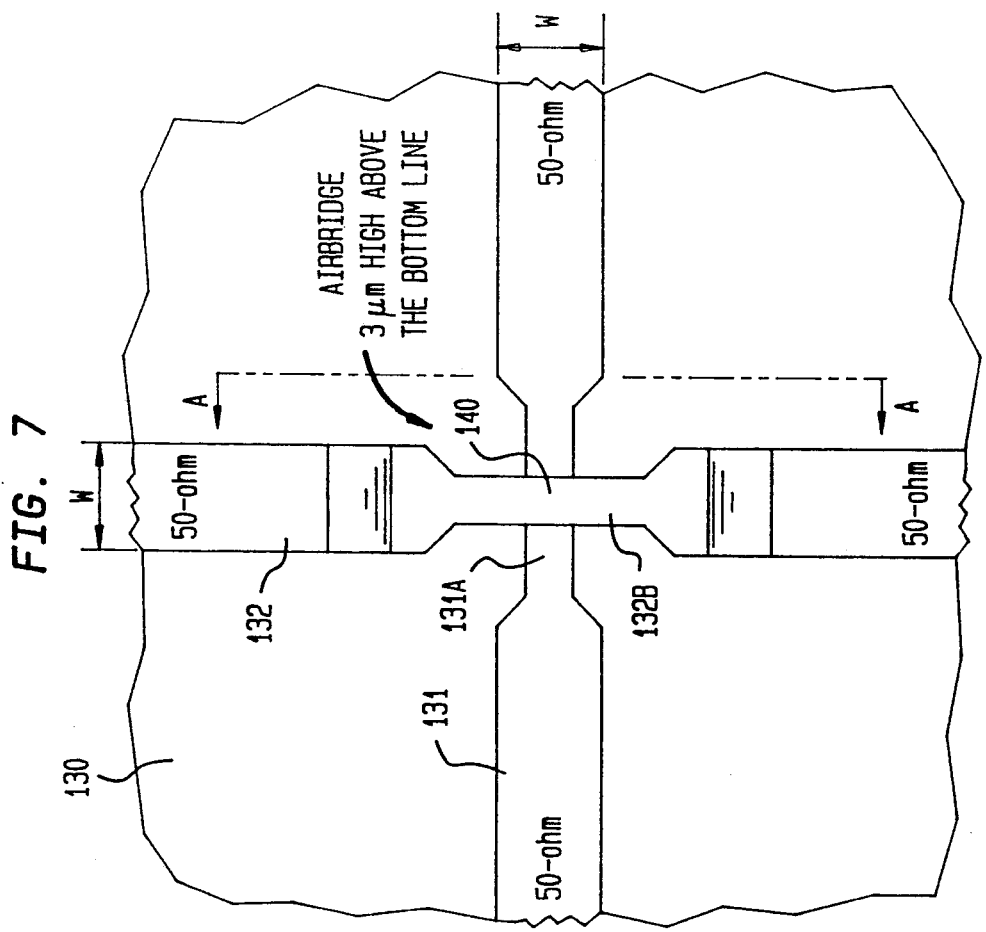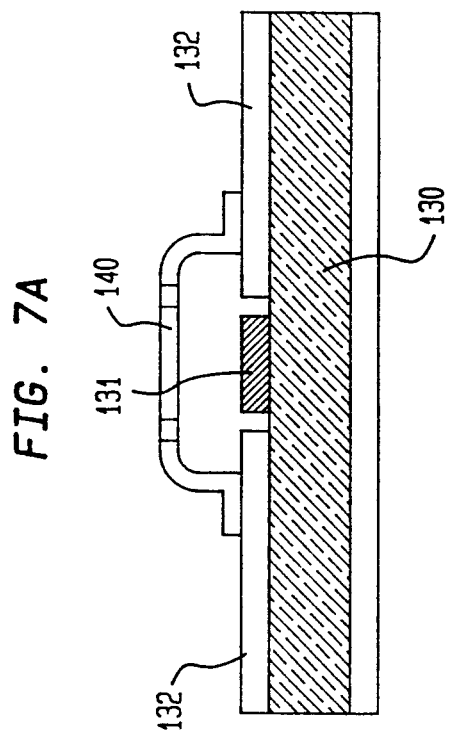

DIGITALLY CONTROLLED MONOLITHIC SWITCH MATRIX USING SELECTABLE DUAL GATE FET POWER DIVIDERS AND COMBINERS

CROSS-REFERENCE TO RELATED APPLICATION

This is a continuation of Ser. No. 07/255,092 filed Oct. 7, 1988, now abandoned.

BACKGROUND OF THE INVENTION

The present invention relates to a microwave switch matrix and more particularly to a switch matrix which can be fabricated utilizing microwave monolithic integrated circuit (MMIC) techniques as those employing gallium arsenide.

RF switch matrices are employed in many applications. Such matrices are used in satellite communications for spot beam transmission. The prior art employed hybrid switch matrices which were made and fabricated from passive microwave components, such as the use of PIN diodes, ferrites, as well as non-planar structures. Switch matrices require high isolation between two non-connected ports. In any event, the hybrid switch matrices which use a non-planar structure to obtain high isolation are extremely large and such circuits cannot be conventionally fabricated employing microwave monolithic integrated circuit techniques (MMIC). Such switch matrices may also be employed in conjunction with phased array radar or phased array antenna systems.

Modern technology has extensively employed monolithic microwave integrated circuits (MMIC) which circuits are fabricated on gallium arsenide substrates. These circuits offer the potential for significant reductions in size, weight and cost, together with increased reliability over conventional hybrid microwave components. Such circuits are widely employed and are particularly attractive in applications as for example in satellite antenna beam switching applications, as well as in applications involving phased array antenna systems such as those employed for example in radar systems. Such antennas normally consist of an assembly of closely packed radiator elements, each of which is driven by a microwave transmit/receive (T/R) circuit module. In such a phased array radar the radiating elements are fed with varying amplitude and phases to shape and position the beam. As such, these systems employ many components such as switch matrices, phase shifters, attenuators, switches, power dividers and so on. As one can understand, in order to optimumly employ such systems and to utilize such systems with minimum cost, MMIC technology is employed.

For an example of suitable circuits which employ such technology, reference is made to co-pending application entitled "A Monolithic Active Digital Attenuator/Amplifier Apparatus" filed on Sep. 22, 1988 as Ser. No. 07/247,966, now abandoned, for T. H. Chen and M. Kumar, the inventors herein, and assigned to the Siemens Corporation, the assignee herein. Reference is also made to a co-pending application entitled "Digitally Controlled Variable Gain Power Divider Apparatus Particularly Adapted for Microwave Applications" filed on Sep. 22, 1988 as Ser. No. 07/247,979, now abandoned, for T. H. Chen and M. Kumar, the inventors herein, and assigned to the same assignee.

In the above-noted applications there are shown circuit arrangements for providing attenuation as well as power division which employ MESFET devices which devices and associated structures can be conveniently integrated utilizing MMIC technology.

The prior art was aware of the need for switch matrices and in particular for such switch matrices which could be fabricated employing microwave integrated circuit techniques. For an example of such prior art, reference is made to U.S. Pat. No. 4,731,594 issued on Mar. 15, 1988 entitled "Planar Active Component Microwave Switch Matrix And Air Bridge For Use Therewith" to M. Kumar and assigned to the General Electric Company. In that patent there is shown a switch matrix for selectively connecting various inputs to various outputs. The switch matrix, as shown in that patent, includes a semi-insulative substrate on one side of which are conductors arranged in rows and columns. The interconnection of the rows and columns form the intersection of the matrix. The patent further shows the use of air bridges which separate the row and column conductors in order to provide isolation. The structure employs active power dividers as well as active power combiners. The power dividers and combiners employ double dual gate FET devices. These devices incorporate two dual gate FETs which share a common source electrode. The patent describes the fabrication of such devices utilizing gallium arsenide integrated circuit techniques in order to obtain a switching matrix configuration.

As one can ascertain from the above-noted patent, there is required a plurality of switches which switches are positioned between an active power divider and an active power combiner and which switches are necessary for circuit operation. Thus the above-noted circuit, apart from the particular devices employed, requires additional components in terms of these switches which make the operation of the circuit difficult and further requires an increased number of components in order to implement operation.

Reference is also made to U.S. Pat. No. 4,472,691 which issued on Sep. 18, 1984 entitled "Power Divider/Combiner Circuit As For Use In A Switching Matrix" issued to M. Kumar, et al. and assigned to The RCA Corporation. This patent describes a 1 port to N port passive signal power divider which for example can be employed in conjunction with switch matrices.

Reference is also made to U.S. Pat. No. 4,609,889 issued on Sep. 2, 1986 entitled "Microwave Frequency Power Combiner" to M. Kumar and assigned to The RCA Corporation. This patent essentially shows an in-phase power combiner constructed of a double field effect transistor having a common drain, first and second gates and first and second source electrodes.

Reference is also made to U.S. Pat. No. 4,611,184 entitled "Microwave Frequency Power Divider" issued on Sep. 9, 1986 to M. Kumar and assigned to the RCA Corporation. This patent shows an in-phase power divider which includes a double field effect transistor having a common source, first and second gates electrodes and first and second drains.

As one can ascertain from the above, the use of switching matrices, including field effect devices for implementing active power dividers and power combiners, are disclosed in the prior art. As indicated, such devices, while utilizing active power dividers and combiners necessitate the use of additional switches to implement matrix operation.

As one can ascertain from the above-referenced patents, monolithic circuits are usually designed on a thin, semi-insulating gallium arsenide substrate. Essentially, components for such a monolithic circuit may be formed by a deposition method, such as a liquid phase epitaxy, vapor phase epitaxy, ion implantation, evaporation, or sputtering. In this manner the circuit elements that can be formed on monolithic circuit substrates include transmission lines, lumped overlay or interdigital capacitors, lumped spiral inductors, thin film resistors, FETs and, when absolutely necessary, transmission line stubs.

Since space is at a premium, lumped elements are preferred to distributed elements The preferred transmission lines are microstrip and coplanar waveguide. Of these two, microstrip has less loss and can be made with characteristic impedances as high as 90 ohms on 125 um gallium arsenide substrates. Since the complete circuit is manufactured using automated techniques, no final adjustments can be made on it after it has been produced. The circuit design must rely heavily on computer modeling, optimization and redundant component configurations.

In such monolithic circuits, FET devices are relatively easy to make. Thus FETs are used for a wide variety of purposes including amplifiers, mixers, frequency multipliers and resistors. Such monolithic circuits are very likely to find increased use in microwave applications requiring large numbers of compact units. The prior art is aware of such considerations and such uses for such circuits. See for example a paper entitled "GaAs IC Applications in Electronic Warfare, Radar and Communication Systems" by D. G. Fisher, published in the Microwave Journal, May 1988, pp. 275-292. Also see an article entitled "Broadband MMIC's For System Applications" by R. W. Bierig et al., published in the Microwave Journal, May 1988, pp. 251-270.

Hence, there is a widespread use of MMIC technology which conventionally employs GaAs substrates to fabricate suitable microwave devices. Such prior art devices include metal semiconductor field effect transistors (MESFETs) fabricated on GaAs substrates. These transistors, as indicated, have been widely employed in the microwave art for frequencies above 5 GHz and have been utilized where improved gain and noise figure are required. The characteristics of such devices have been described in the co-pending applications as well as in some of the cited references. Techniques for fabricating such devices, including techniques for fabricating the transmission lines associated with such devices, are known in the prior art.

It is an object of the present invention to provide an improved monolithic active switch matrix which employs an active power divider switch, an active power combiner switch and an air bridge for use therewith and to provide isolation.

Essentially, a main object of the present invention is to provide a digitally controlled monolithic active switch matrix which matrix employs integratable components and which components can be employed to fabricate large switch arrays utilizing the same basic circuit configurations.

The present invention employs structure which reduces the number of components necessary to provide an active switch matrix as compared to prior art techniques.

BRIEF DESCRIPTION OF THE PREFERRED EMBODIMENT

A digitally controlled switch matrix module for directing power from first and second input ports to first and second output ports, comprising, an active power divider means having an input terminal coupled to said first input port and having a first and a second output terminal, said active power divider means including first and second control terminals associated with said first and second output terminals and operative when activated by a control signal to selectively apply power to said first and second output terminals with said first output terminal connected to said first output port, an active power combiner means having a first input terminal coupled to said second input port and having a second input terminal coupled to said second output terminal of said active power divider means, and having an output terminal connected to said second output port and including first and second control terminals associated with said first and second input terminals and operative when activated by a control signal to apply power at said first and second input terminals to said output terminal, with said first output terminal of said power divider means as coupled to said first input port overlying said first input terminal of said active power combiner as coupled to said second input port and isolated therefrom by an air bridge means to provide isolation between said first output ports and said input port when power is directed from said first input port to said first output port, digital control means coupled to said control terminals of said active power divider and combiner means to selectively apply control signals thereto to switch power from any one of said first and second input ports to any one of said first and second output ports.

BRIEF DESCRIPTION OF THE FIGURES

FIG. 7 is a schematic diagram of an air bridge crossover which achieves greater than 40 db isolation when employed in this invention;

FIG. 7a is a cross-sectional view taken through line A—A of FIG. 7;

DETAILED DESCRIPTION OF THE INVENTION

Figure 1:
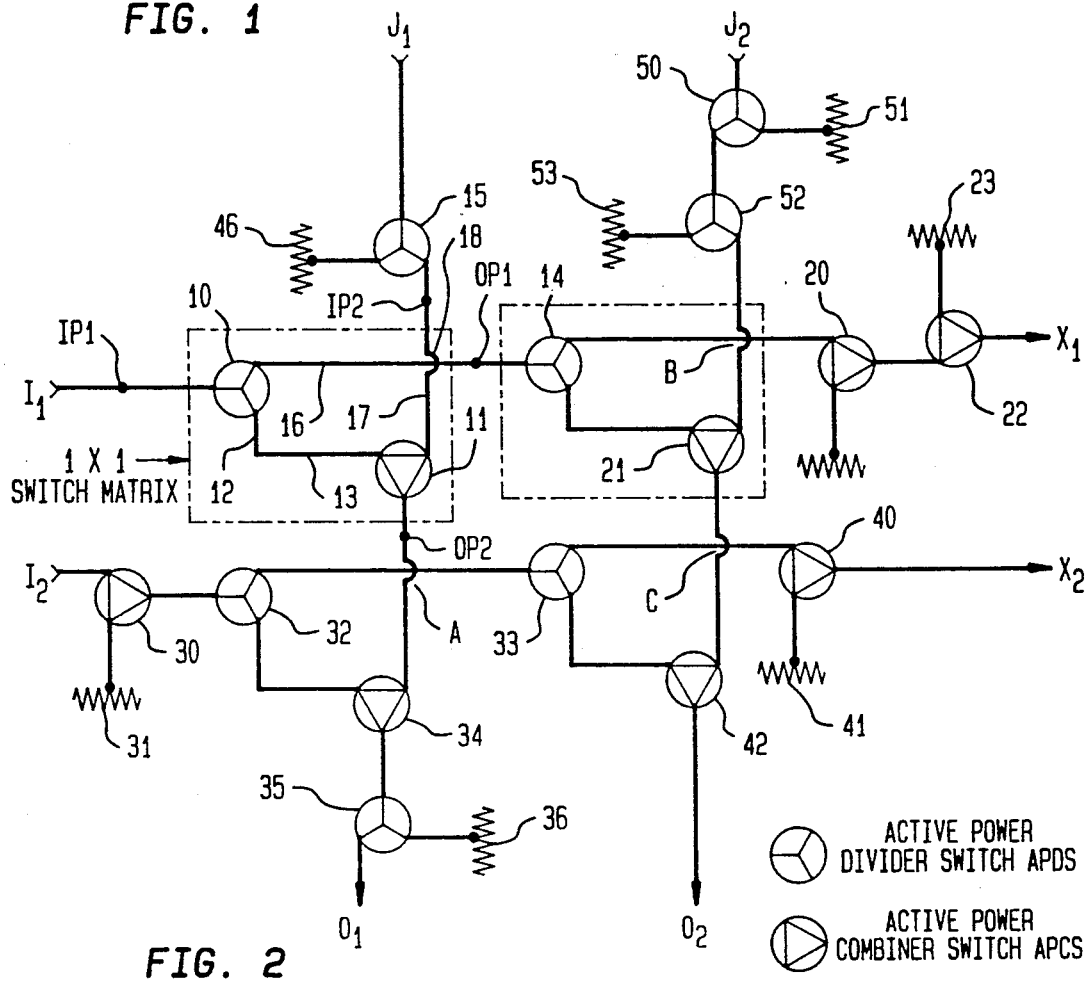
FIG. 1 is a block diagram of a 2×2 switch matrix according to this invention.

Referring to FIG. 1, there is shown a block diagram of a 2×2 switch matrix. Essentially, as seen by the legend of FIG. 1, the switch matrix includes active power divider switches (APDS) and active power combiner switches (APCS). The designations, as APDS and APCS, are employed together with the symbols indicated in the legend to more clearly show and describe the operation of the matrix.

Figure 2:
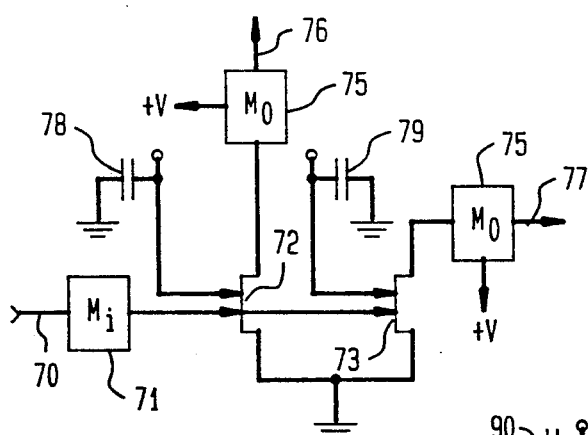
FIG. 2 is a circuit schematic diagram of an active power divider switch or APDS device employed in this invention.
Figure 3:
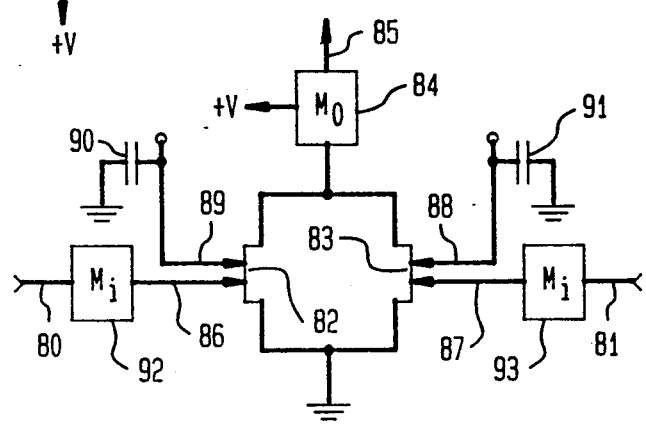
FIG. 3 is a schematic diagram of an active power combiner switch or APCS device employed in this invention.

The circuit configuration for the APDS is shown in FIG. 2 while the circuit configuration for the APCS is shown in FIG. 3. Both configurations employ two dual-gate FET devices which are N-channel MESFETs and which devices are fabricated on a gallium arsenide substrate by conventional monolithic circuit techniques.

As one can ascertain from FIG. 1, the matrix includes two main or primary input ports designated as $I_1$ and $I_2$. There are also shown two auxiliary input ports $J_1$ and $J_2$. Switch matrix, being a 2×2 matrix, has two main output ports designated as $O_1$ and $O_2$ and two auxiliary output ports designated as $X_1$ and $X_2$. It is a main objective of a switch matrix to provide a connection between selected input ports and selected output ports. The matrix essentially consists of a basic building block, as shown in dashed line configuration of FIG. 1. This building block is a 1×1 switch matrix module and is employed four times to construct the 2×2 matrix array. The building block or 1×1 matrix contains an active power divider switch (APDS) 10, an active power combiner switch (APCS) 11 and a 50 ohm air bridge line crossover 18.

The active power divider switch or APDS 10 has two power output terminals 12 and 16 and a single power input terminal (IP1). The active power combiner switch (APCS) 11 has two input terminals 13 and 17 and one output terminal (OP2). One power output terminal 12 of APDS 10 is connected to one input terminal 13 of the APCS 11. The other power output terminal 16 is connected to the input terminal of an identical active power divider switch 14. The other input of the active power combiner switch, APCS 11, is connected to an output of an APDS 15. The cross-over between the output power line 16 of the APDS 10, which crosses the input power line 17 of the APCS 11 is implemented by means of an air bridge 18 which will be further explained. Essentially, the air bridge is utilized to provide a high degree of isolation between inputs and outputs as required in a switch matrix. Reference is also made to U.S. Pat. No. 4,731,594 where such an air bridge is described in detail and will be further described in the specification below.

Thus the switch matrix module shown in dashed line configuration in FIG. 1 is employed as a basic building block in the 2×2 matrix. The switch matrix module has an input port (IP1) which is connected to the primary input port $I_1$ and which is also connected to the input terminal of APDS 10. APDS 10 has first and second output terminals, with the first output terminal 16 (OP1) directed to the input terminal of APDS 14 via a microstrip transmission line. The second output terminal 12 of APDS 10 is connected to one input terminal of APCS 11. The other input terminal of APCS 11 (IP2) is adapted to receive an output from APDS 15, which has its input coupled to the auxiliary input port $J_1$. The output of APCS 11 (OP2) is the second output terminal of the 1×1 switch matrix module. The input line 17 (IP2) of the APCS 11 and the output power line 16 (OP1) of APDS 10 are microstrip transmission lines crossing over one another by means of an air bridge, as will be explained.

Thus the structure and orientation of the 2×2 switch matrix shown in FIG. 1 is as follows. The first primary input port $I_1$ is connected to the power input of the active power divider switch APDS 10. One output of the APDS 10 designated by numeral 16 is coupled to the input of another APDS 14. The outputs of APDS 14 are coupled respectively to one input of APCS 20 and to one input of APCS 21. The output of APCS 20 is coupled to one input of APCS 22 with the other input of APCS 22 terminated in a suitable termination resistor 23. The output port of APCS 22 serves as the auxiliary output port $X_1$. The APCS 20 and APCS 22 are included to further control the gain and phase through the matrix to compensate for different path lengths thus providing good phase and amplitude tracking between different input and output ports.

The second primary input port $I_2$ is first connected to one input of an APCS 30. The other input of APCS 30 is terminated in a terminating resistor 31. The output of APCS 30 is coupled to the input of an APDS 32 having one output coupled to the input of APDS 33 and one output coupled to an input of APCS 34. The other input of APCS 34 is coupled to the output of APCS 11. The output of APCS 34 is coupled to one input of APDS 35. One output of APDS 35 is terminated in a terminating resistor 36 while the other output of APDS 35 serves as the primary output port $O_1$. As indicated, one output of APDS 32 is coupled to the input of APDS 33. APDS 33 has one output coupled to the input of APCS 40 with the other input of APCS 40 terminated in a resistor 41 and with the output of APCS 40 operating to accommodate the second auxiliary output port $X_2$. The other output of APDS 33 is coupled to one input of APCS 42 with the output of APCS 42 serving as the second primary output port $O_2$. The other input of APCS 42 is coupled to the output of APCS 21.

As seen, the auxiliary input port $J_1$ is coupled to the input of APDS 15, which has one output terminated in a terminating resistor 46 with one output coupled to the input of APCS 11. The auxiliary port $J_2$ is coupled to the input of APDS 50 with one output of APDS 50 terminated in a resistor 51 and the other output of APDS 50 coupled to the input of APDS 52 with one output of APDS 52 terminated in a resistor 53 and the other output of APDS 52 coupled to the input of APCS 21. The stages APDS 15, 35, 50 and 52 serve to compensate for path length differences as described as do the additional APCS stages 20, 23, 30 and 40.

As one can ascertain, the primary input port as $I_1$ can communicate with output ports as $X_1$, $O_1$, and $O_2$. The primary port $I_2$ can communicate with output ports $o_1$, $O_2$ and $X_2$. In a similar manner, the auxiliary input ports as $J_1$ can communicate only with output port $O_1$. Input port $J_2$ can only communicate with output port $O_2$. Each power divider APDS and power combiner APCS is associated with respective control terminals to enable the input of an APDS to be applied to both output terminals or to one output terminal and to enable any input or both inputs of the APCS to be connected to the output.

The operation of the switch matrix of FIG. 1 is as follows. In order to couple the input port $I_1$ to the output port $O_1$, it is seen that signal is applied by the APDS 10 to its output 12 to one input of APCS 11. The output of APCS 11 is coupled to one input of APCS 34 whose output is coupled to the input of APDS 35 thus applying the input signal at $I_1$ to the output at $O_1$. It is of course understood that in order for the above path to be implemented, APDS 10, APCS 11, APCS 34 and APDS 35 must be in the ON condition. If this is implemented then power applied at the input port $I_1$ will be coupled to the output port $O_1$. The ON condition of these devices is implemented by applying a suitable bias control signal to a control terminal of each device.

In a similar manner, if APDS 10, APDS 14, APCS 20 and APCS 22 are ON then signal applied to primary port $I_1$ will be coupled to the auxiliary output port $X_1$. Hence, as one can ascertain, selected input ports can communicate with selected output ports in regard to the 2×2 switch matrix depicted in FIG. 1. The means of communication or the means for causing an APDS or APCS to be turned ON will be shown and described in regard to FIGS. 2 and 3.

When the switch matrix shown in FIG. 1 is employed as a 2×2 switch matrix, ports $J_1$, $J_2$, $X_1$ and $X_2$ are terminated. However, as will be further explained, the 2×2 matrix of in FIG. 1 is employed as a basic building block to construct N×M switch matrices. In such configurations the auxiliary input ports, as $J_1$, $J_2$, as well as the auxiliary output ports, as $X_1$ and $X_2$ are respectively connected to $O_1$ and $O_2$ ($I_1$ and $I_2$) of the adjacent block whenever it is available. In this manner one can construct matrix configurations of M×N configurations. Such matrices can be constructed by utilizing the configurations shown in FIG. 1, as will be further explained.

Referring to FIG. 2 there is shown a schematic diagram of a typical APDS, or active power divider switch, as for example switches 10, 14, 15, 32, 33, 35, 50 and 51 of FIG. 1. As seen, each APDS switch has a single input terminal 70 which is coupled to the input of a typical matching network 71 ($M_i$). The output of the matching network 71 is coupled to one gate electrode of a first double gate FET device 72. A second double gate FET device 73 has one gate electrode connected to the input gate electrode of FET 72. As shown in FIG. 2, both FET devices 72 and 73 are dual gate FET devices which may be fabricated on a gallium arsenide substrate and are N-channel MESFETs. The source electrodes of FETs 72 and 73 are connected together at a point of reference potential while the drain electrodes of 72 and 73 are coupled respectively to matching networks 74 and 75 (MO). The matching networks 74 and 75 are well known circuits and operate to connect the drain electrodes of FETs 72 and 73 to a suitable operating potential, as +V, while further operating to provide a desired output impedance for each drain electrode which for example may be 50 ohms.

The outputs of the matching networks 74 and 75 serve as the two power outputs for the active power divider switch and are designated as 76 and 77. The other gate electrodes of each FET 72 and 73 are RF bypassed by means of capacitors 78 and 79. These gate electrodes are used as switching control terminals to operate each individual APDS. Thus, if a positive potential is applied to the second gate electrodes then both dual gate FET devices will be biased in the ON state which will cause current to flow through each dual gate FET device to the outputs 76 and 77.

In a similar manner, if the control gate electrodes are biased with a negative bias voltage this will operate to pinch the channels of the FET devices OFF and hence no current can flow. In this manner, by applying a positive voltage to the control gate electrodes of FETs 72 and 73, one can direct power to both or either output terminal 76 and 77. The input signal, as applied to terminal 70, will be equally divided at terminals 76 and 77 when both dual gate FETs as 72 and 73 are biased in the ON condition. As one can also ascertain, by changing the voltage at a gate electrode, one can bias one of the two transistors, as 72 and 73, in the OFF state or one can bias both devices in the OFF state. It is further understood that the power division between FETs 72 and 73 can be varied in any appropriate manner. In this manner, while the power divider or APDS as shown in FIG. 2 will provide equal power outputs at terminals 76 and 77, one can obtain different power outputs by controlling the transconductance of FETs 72 and 73 as by changing the gate widths of the FETs with respect to one another. Hence, one can obtain a variable power division between different APDSs. However, for purposes of economy and symmetrical circuit configuration, it is preferred that the dual gate FET devices 72 and 73 be identical in construction and configuration and therefore the power division at terminals 76 and 77 will be equal when the respective devices 72 and 73 are in the ON state.

Referring to FIG. 3 there is shown a schematic diagram of an APCS device as for example devices 11, 20, 21, 22, 30, 34, 40 and 42 of FIG. 1. Again as seen, the APCS device includes two dual gate FET devices 82 and 83. An APCS device has two inputs designated as 80 and 81 and a single output 85. Input 80 is coupled through the matching network 92 to the gate electrode 86 of a first FET 82. The second gate electrode 89 of FET 82 is RF bypassed to ground via capacitor 90. The drain electrode of the dual gate FET 82 is coupled to the drain electrode of the dual gate FET 83. The output drain electrodes of FETs 82 and 83 are coupled to a source of potential +V via a matching network 84 to provide a suitable output impedance at the output terminal 85.

The other input 81 is coupled through a matching network 93 to the gate electrode 87 of FET 83. The other gate 88 of FET 83 is bypassed to ground via capacitor 91. It is seen that gate electrodes 88 and 89 operate as control or switching electrodes to thereby provide selective power combining at the output terminal 85. Each FET device as 82 and 83 can be turned ON by a positive voltage applied to gate electrodes 88 and 89 or can be turned OFF by a negative voltage applied to these electrodes. Power combining will occur for inputs 80 and 81 when FET devices 82 and 83 are turned ON resulting in a combined power output signal at terminal 85.

Either FET 82 or 83 can be turned ON thereby coupling power from any one input terminal as 81 to output terminal 85 and so on. It is preferred that the FET devices 82 and 83 are of the identical configuration as devices 72 and 73 as shown in FIG. 2. Proper connections between sources and drain electrodes for the respective devices can be directly made on the integrated circuit chip by utilizing conventional bonding pads, as explained in many of the above-noted references. It is immediately noted that each of the devices, as shown in FIG. 2 and FIG. 3, are active devices and are therefore capable of providing gain for the power divider devices APDS and the power combiner devices APCS. If gain is provided, one can be assured that there will be no power loss through the switch matrix.

Each of the devices as indicated in FIGS. 2 and 3 utilize similar matching networks for input and output terminals thereby further reducing the complexity of the circuit configuration and affording increased reliability in operation.

Figure 4:
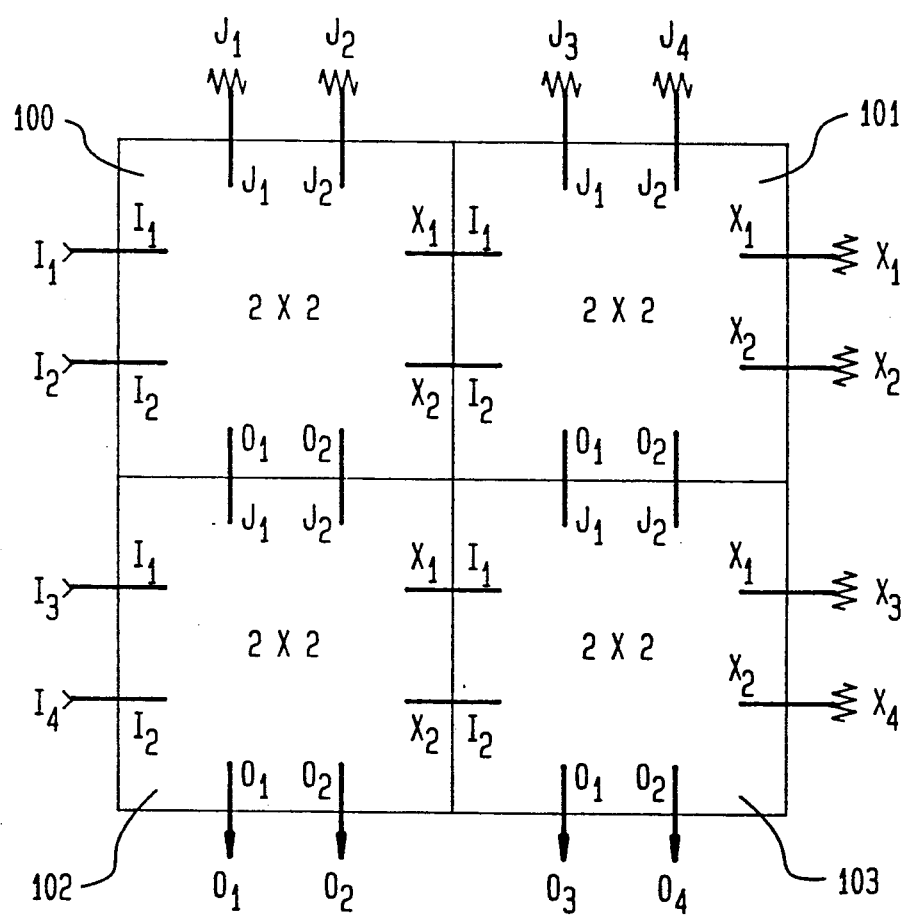
FIG. 4 is a schematic diagram of a 4×4 switch matrix constructed by utilizing four 2×2 matrices as shown in FIG. 1.

Referring to FIG. 4 there is shown a 4×4 matrix which is constructed employing four 2×2 matrix configurations, as shown in FIG. 1. The 4×4 matrix is formed by coupling the auxiliary input and output leads as indicated in FIG. 4. Thus, a first 2×2 matrix 100 having input ports $I_1$ and $I_2$ is coupled to an identical second 2×2 matrix 101 having inputs $I_1$ and $I_2$. As one can ascertain from FIG. 4, the first 2×2 matrix 100 is coupled to the second 2×2 matrix 101 and to a third and a fourth 2×2 matrix 102 and 103, all of the same configuration as the matrix shown in FIG. 1.

In order to provide such coupling the auxiliary outputs $X_1$ and $X_2$ of matrix 100 are coupled to the primary inputs $I_1$ and $I_2$ of matrix 101. The auxiliary inputs of matrix 100, as $J_1$ and $J_2$ are terminated in suitable terminating resistors as are the auxiliary inputs $J_1$ and $J_2$ of matrix 101. The auxiliary outputs ($X_1$ and $X_2$) of matrix 101 are also terminated in suitable terminating resistors. The 2×2 matrix 100 is also coupled to matrix 102 by coupling the primary output ports $O_1$ and $O_2$ of matrix 100 to the auxiliary input ports $J_1$ and $J_2$ of matrix 102. The primary input ports of matrix 102 as $I_3$ and $I_4$ serve as two additional input ports thus providing four input ports for the 4×4 matrix of FIG. 4, namely, input ports $I_1$, $I_2$, $I_3$ and $I_4$. The output ports of the 2×2 matrix 102 serve as two output ports designated as $O_1$ and $O_2$. The auxiliary output ports $X_1$ and $X_2$ of matrix 102 are coupled to the primary input ports $I_1$ and $I_2$ of matrix 103 with the primary output ports $O_1$ and $O_2$ of matrix 103 serving as two additional output ports $O_3$ and $O_4$ for the 4×4 switching matrix. As seen, all auxiliary output ports of each of the matrices which are not employed are terminated in suitable terminating resistors as $X_1$, $X_2$, $X_3$ $X_4$. All auxiliary input ports as $J_1$ and $J_2$ of matrices 100 and 101 are also terminated. Thus, as one can see from FIG. 4, there is provided a 4×4 switch matrix which is formed by utilizing the 2×2 matrix of FIG. 1 as a basic module.

Figure 5:
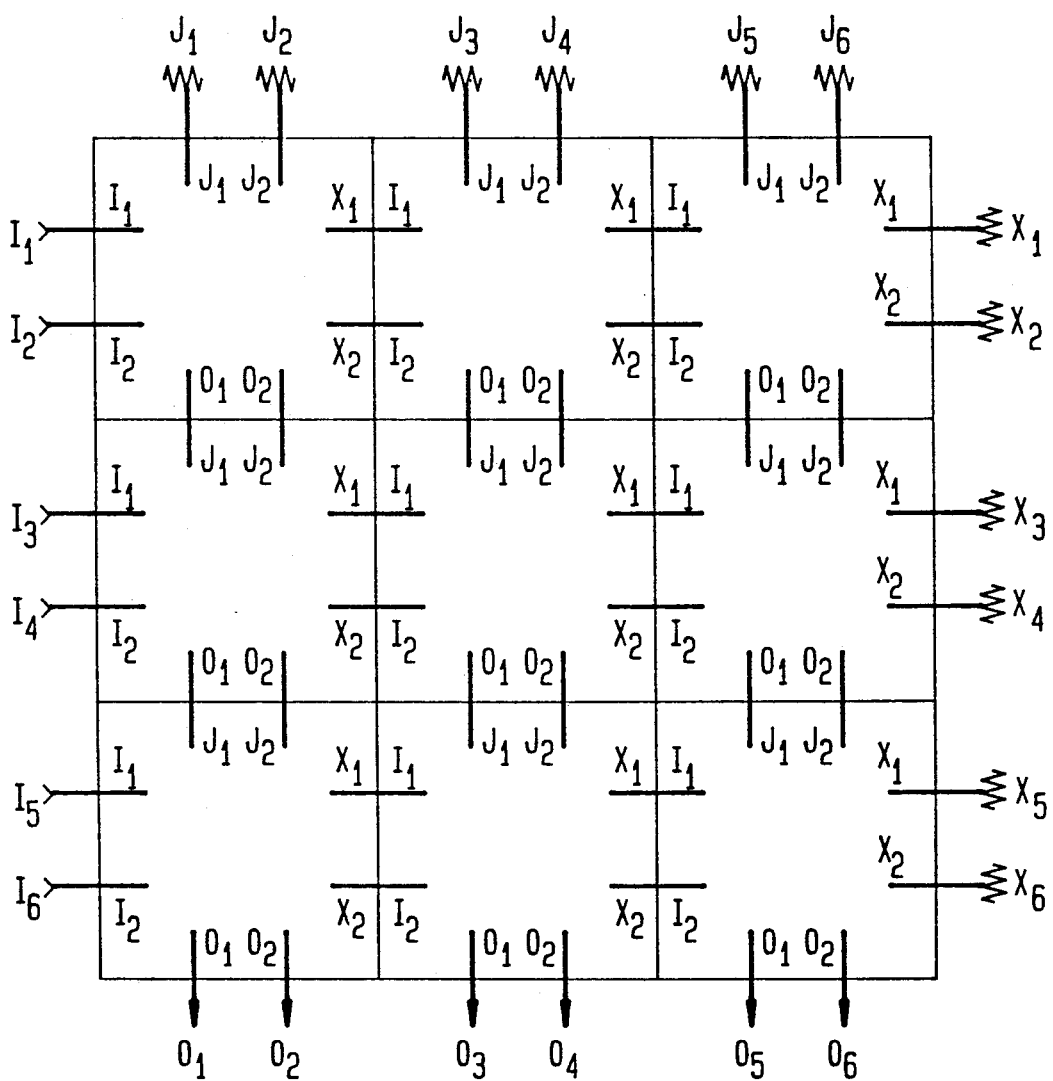
FIG. 5 is a schematic diagram of a 6×6 switch matrix utilizing nine 2×2 matrices as shown in FIG. 1.

Referring to FIG. 5 there is shown a 6×6 configuration which employs nine 2×2 matrices as those in FIG. 1 with their respective ports connected or terminated as shown. It is thus seen that by utilizing the 2×2 switch matrix as a building block, one can configure matrices of N×N or M×N configurations with the input and output auxiliary ports connected as shown. Each of the submatrices, as 100-103 of FIG. 4, are of identical configuration with their respective ports connected as shown in FIG. 4 for a 4×4 matrix and in FIG. 5 for a 6×6 matrix.

It is therefore indicated that many other matrix configurations (M×N), as for example 3×2 or 5×6 can be configured as well. In such configurations certain of the primary input ports will also be terminated and hence one can configure other matrix configurations as indicated.

As shown in FIG. 1, the basic switch matrix module employed is a 1×1 matrix with the additional APDS and APCS devices, as for example 15, 30, 50, 52, 20, 22, 40 and 35, serving to compensate for path length differences between the various paths thus providing good phase and amplitude tracking between the different input and output ports.

Figure 6:
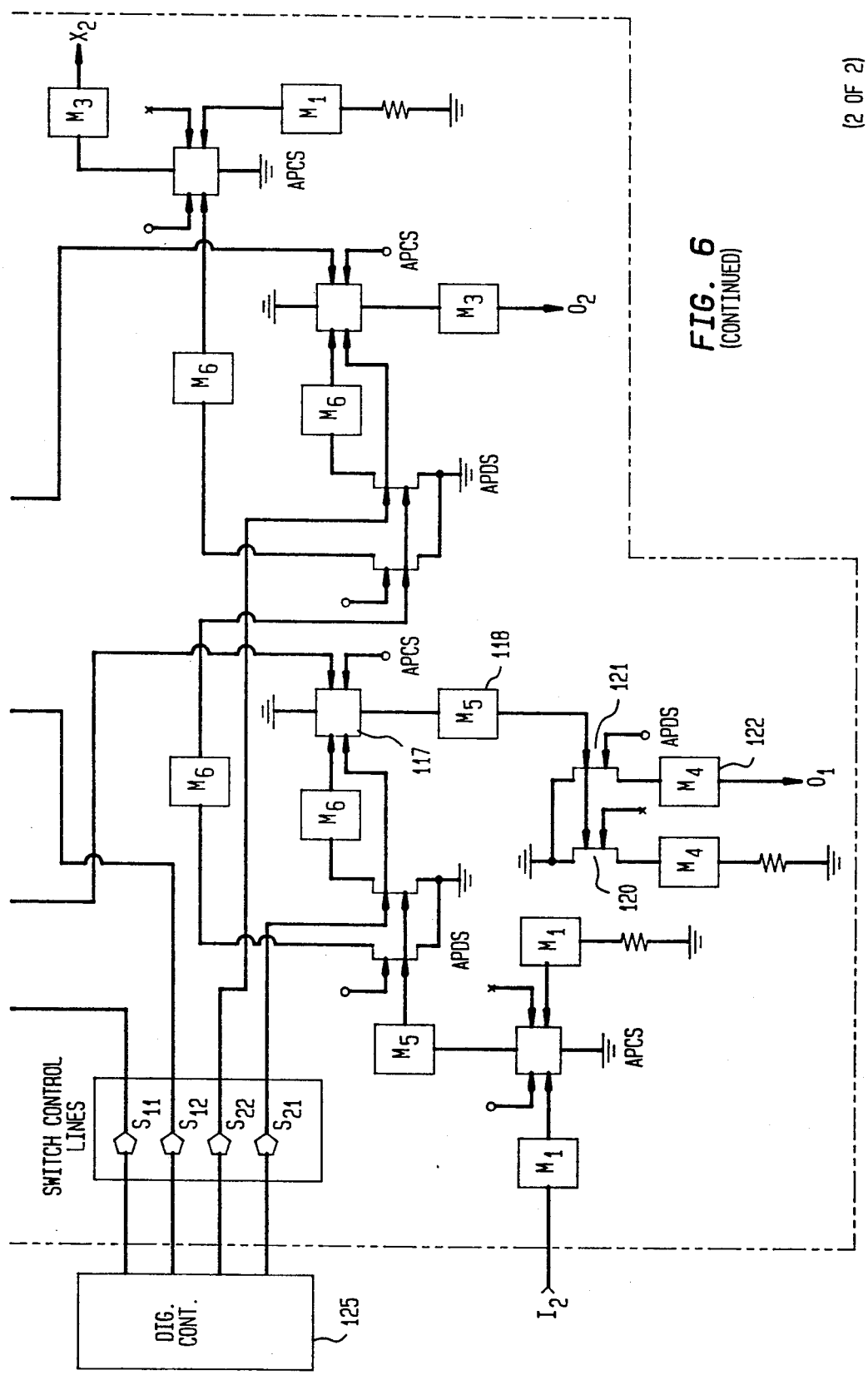
FIG. 6 is a detailed schematic diagram of the switch matrix shown for example in FIG. 1.

Referring to FIG. 6 there is shown a detailed schematic diagram of a 2×2 switching matrix. The boxes designated by $M_1$ through $M_6$ are the matching networks of the APDS and APCS devices, as for example shown in FIGS. 2 and 3. In the configuration shown in FIG. 6 there are eight signal channels. Namely, the input designated as $I_1$ can be connected to the output $O_1$, $O_2$ or $X_1$. In a similar manner the input $I_2$ can be connected to output $O_1$, $O_2$ or $X_2$. The input $J_1$ can be connected to output $O_1$ and the input $J_2$ can be connected to output $O_2$. In order to reduce complexity the suitable switching or control gate electrodes associated with the respective FETs are shown as a circle to indicate an ON condition or as an X to indicate an OFF condition. The four primary switch channels, as $I_1$ to $O_1$, $I_1$ to $O_2$, $I_2$ to $O_1$, $I_2$ to $O_2$ are controlled by four switch control lines designated as $S_{11}$, $S_{12}$, $S_{22}$ and $S_{21}$, respectively. These lines are connected to a digital control generator 125 which applies the suitable control signals as desired by means of a system program or other predetermined sequence. In FIG. 6, due to the biasing shown, $I_1$ is always connected to $X_1$. $I_2$ is connected to $X_2$. $J_1$ is connected to $O_1$ and $J_2$ is connected to $O_2$. To prevent this from occurring one only has to render a device from the ON to the OFF state in each path.

It is noted that in FIG. 6 some of the circuits are shown by actual circuit configurations while others are shown in terms of a block diagram format both for the APDS.

The primary input port I1 can be connected to the primary output port $O_1$, as will be explained. In view of this explanation one can therefore determine from FIG. 6 how each input port can be connected to the requisite output ports to implement the above-described signal paths. The primary input port $I_1$ is connected to matching network 110. The output of matching network 110 is coupled to the gate electrode of FET 111. The FET 111 forms an APDS in conjunction with FET 112. As seen from FIG. 6, FET 111 is biased in the ON state by means of a positive potential applied to the other gate electrode. The other gate electrode of FET 112 is connected to the $S_{11}$ line which is made positive to implement the desired path. In this manner power is applied via the matching network 114 to an input of the APCS device 115. As seen in FIG. 6, one gate electrode of the APCS device is biased in the positive condition and the other gate electrode of the APCS device is biased by the $S_{11}$ lead also positive. Therefore the output of APCS device 115 via matching network 116 provides output power to the input electrode of APCS device 117.

The APCS device 117 has the other input electrode biased in the ON condition. Thus, power is applied via the APCS device 117 through the matching network 118 to the output of the APDS device consisting of transistors 120 and 121. As seen, FET 121 is biased in the ON condition and therefore power is applied through matching network 122 to the primary power output port O1. FET 120 is biased OFF and hence does not conduct. Both FETs 120 and 121 form the output APDS as indicated.

Also shown in FIG. 6 is a dashed line drawn about the circuit configuration to indicate that the entire circuit, including all matching networks, resistive impedances, switch control terminals and so on, can be fabricated by gallium arsenide integrated circuit techniques wherein each of the FET devices is an N-channel dual gate FET of a MESFET configuration.

As one will understand in reviewing FIG. 6, any one of the inputs indicated as $I_1$, $I_2$, $J_1$ and $J_2$ can be connected to respective output ports. It is also understood that by using additional switching leads different connections can be made. However, $I_1$ cannot be connected to $X_2$. $I_2$ cannot be connected to $X_1$. $J_1$ cannot be connected to $O_2$, $X_1$, or $X_2$ and $J_2$ cannot be connected to $O_1$, $X_1$ or $X_2$.

Again referring to FIG. 6 and FIG. 1, one will understand that the APDS device 10 (FIG. 1) is equivalent to device including MESFETs 111 and 112. The APCS device 11 is equivalent to the APCS device 115 of FIG. 6. The APCS device 34 of FIG. 1 is equivalent to the APCS device 117 of FIG. 6 with the APDS device 35 of FIG. 1 being equivalent to the APDS device of FIG. 6 containing MESFETs 120 and 121. Thus, as one will understand, the schematic or general block diagram shown in FIG. 1 is a simplified representation of the detailed schematic shown in FIG. 6.

Again referring to FIGS. 4 and 5, one can easily understand how large switch matrix arrays can be fabricated utilizing the basic 2×2 switch module.

Again referring to FIG. 1, it was indicated that one of the key elements of the monolithic switch matrix as depicted is a 50 ohm crossover. Referring to FIG. 1 one 50 ohm crossover is indicated by reference numeral 18. The output of APDS 15 is applied to the input of APCS 11 with the lead connecting the two, crossing over a transverse lead 16. The lead 16 couples one output of APDS 10 to the input of APDS 14. Other crossovers are designated by the letters A, B and C in conjunction with FIG. 1 and depict other 50 ohm crossover points. As indicated, the purpose of the 50 ohm crossover or air bridge is to provide isolation between input and output ports which are not connected via the switch matrix.

Referring to FIG. 7 there is shown an air bridge for accomplishing the above-noted separation and isolation. As shown in FIG. 7, a portion of the gallium arsenide substrate 130 is illustrated. Conductor 131 on the substrate 130 corresponds to a conductor of FIG. 1 such as for example the conductor which connects the output of APDS 10 to the input of APDS 14. The transverse conductor 132 corresponds to the conductor which connects the output of APDS 15 to the input of APCS 11. Each conductor, as 131 and 132, is generally of a width W and is a microstrip transmission line. An exemplary width is between 70 to 80 um for a 50 ohm microstrip line for a substrate thickness of 100–125 um. In any event, this can be calculated using well known techniques.

As seen, conductor 132 tapers into an air bridge whereby there is a thin portion of conductor 132 positioned above a thin portion of conductor 131, as more clearly shown in FIG. 7A. This air bridge is 3 um in height above the bottom conductor line 132 also shown in FIG. 7A. As seen in FIG. 7, both conductors 131 and 132 taper before the reduced portions which essentially form the crossing air bridge. The tapers typically are at 45°. The width of the reduced portions of both conductors 131a and 132b are selected to be about 70-75 ohms so that the discontinuity impedances of the conductors is small. The length of the conductors, as 131A and 132B, is selected to be about 3 W at 4 GHz which is less than 1/100th of the wave length at this frequency. The selection of width as well as the fabrication of such conductors with the air bridge 140 is known in the art and reference is made to U.S. Pat. No. 4,731,594 where a complete description of a typical air bridge configuration is shown.

Figure 8:
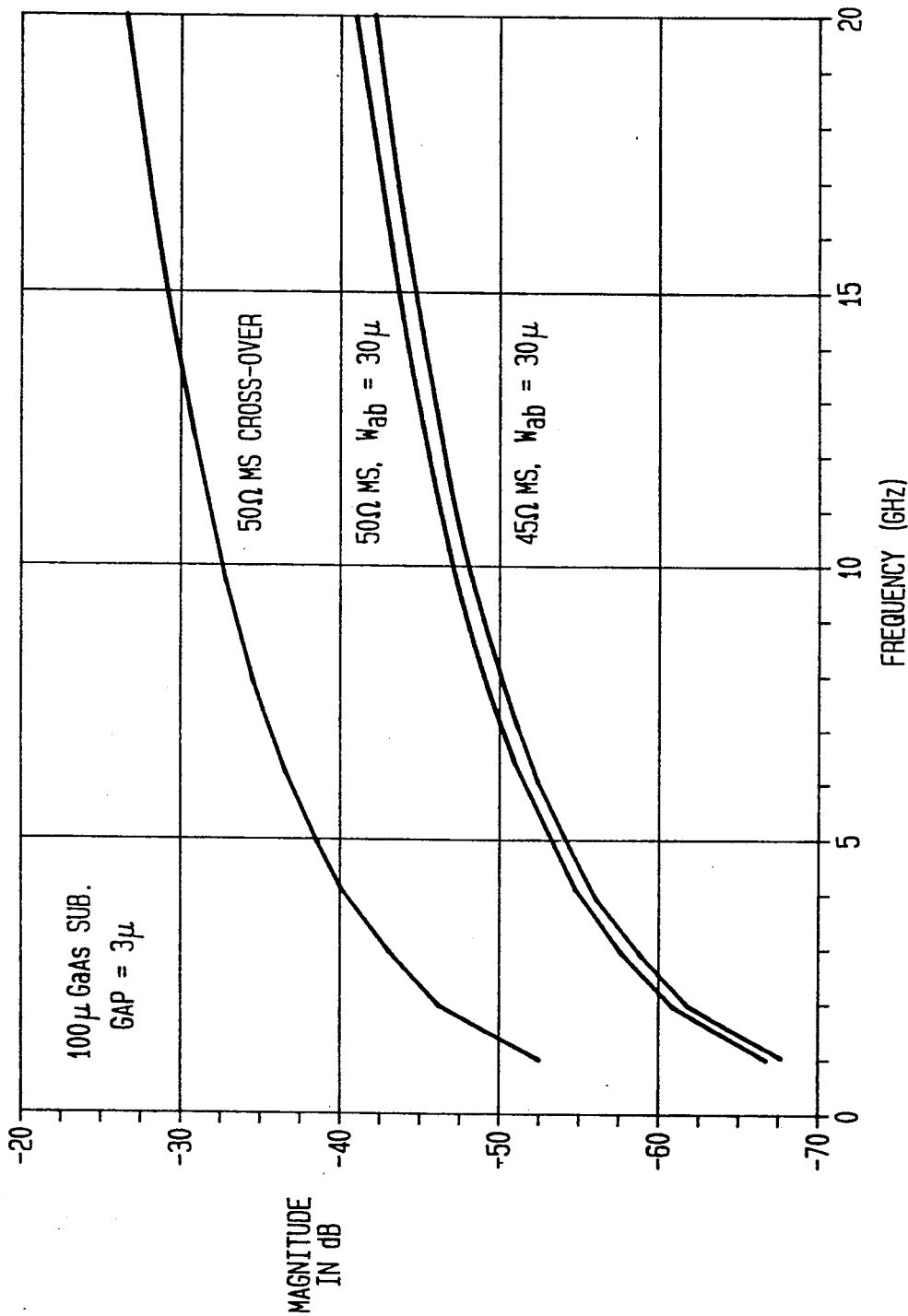
FIG. 8 is a series of graphs showing the isolations afforded by the air bridge as a function of frequency.

FIG. 8 is a graph depicting, as functions of frequency, the isolations afforded by a 50 ohm microstrip crossover, a 50 ohm microstrip with a 30 micron wide air bridge crossover and a 45 ohm microstrip with a 30 micron wide air bridge crossover. The air bridge crossover referred to in FIG. 8 is the air bridge 140 as shown in the cross-sectional view of FIG. 7a.

Figure 9:
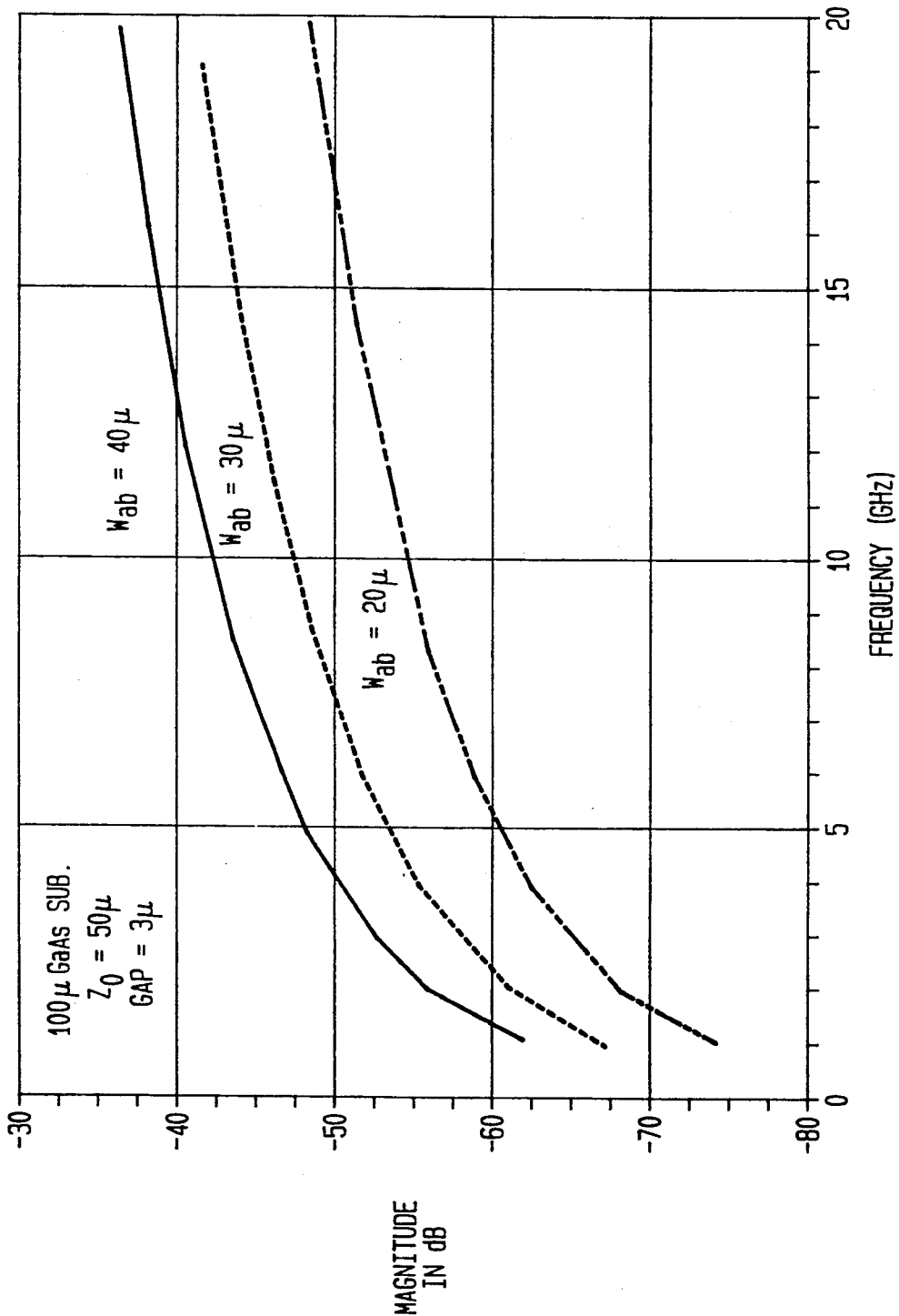
FIG. 9 is another series of graphs depicting the isolations afforded by the air bridge as a function of frequency.

FIG. 9 shows a graph which depicts the isolations as functions of frequency for 50 ohm microstrip with a 20 micron, a 30 micron and a 40 micron wide air bridge crossover. As one can ascertain, by providing the air bridge crossover one provides high isolation between the two transverse 50 ohm microstrips. It is understood that the switch matrix, in order to be useful, requires isolation of more than 40 db between two non-connected ports. In order to achieve 40 db isolation, the line width as for example 131a and 132b of FIG. 7 has been reduced to reduce the coupling capacitance that is responsible for the poor isolation. The air bridge depicted in FIG. 7 is of an effective electrical length which is much less than a wave length. The reduction in line width at the crossover region does not present any substantial impedance mismatch as will be understood by those skilled in the art. The effect of reducing the line width at the air bridge crossover point on the isolation is clearly seen in both FIGS. 8 and 9.

It is also understood that by using a lower impedance line which, for example, is lower than 50 ohms, one can also improve the isolation as shown in FIG. 8.

Hence, as one can understand from the above, there is described a digitally controlled monolithic active switch matrix 1×1 module which basically consists of an active power divider switch or an APDS, an active power combiner switch or an APCS and a 50 ohm line crossover. Each of the active power divider and active power combiner switches employ two dual gate FETs. The digitally controlled monolithic active switch matrix provides high isolation using a monolithic 50 ohm line crossover. The device is of monolithic construction and therefore can be fabricated on a gallium arsenide substrate using conventional MMIC techniques. In view of this, it is extremely small and capable of broadband operation. Since the 1×1 switch matrix module serves and operates as a building block, one can employ the basic configuration to produce or construct larger size switch matrices as N×M matrices.

Since both the power divider and power combiner switches employ active devices, one can provide gain for each of these elements and therefore provide a switch matrix which has no loss or even provides gain from input to output ports. Based on the ability to completely identify the individual module, one can construct an accurate computer model and therefore add various stages to obtain excellent amplitude and phase tracking between input and output ports. The switch matrix is capable of being digitally controlled, as for example by applying suitable control signals (FIG. 6) as $S_{11}$ to $S_{22}$. In this manner the operation of the switch matrix can be digitally activated.

What is claimed is:

1. A digitally controlled switching apparatus for selectively directing power from at least one input port and at least one auxiliary input port to at least one input port and at least one auxiliary output port, comprising:

a first active power divider means having an input terminal connected to a first input port, a first output terminal, and a second output terminal coupled via a third circuit means to a first auxiliary output port, the first active power divider means comprising first and second dual gate FETs each having source, drain, and first and second gate electrodes, the first gate electrodes of the first and second dual gate FETs being connected together and to the input terminal, the source electrodes of the first and second dual gate FETs being connected together and to a point of reference potential, the drain electrode of the first FET connected to the first output terminal, the drain electrode of the second FET connected to the second output terminal, and the second gate electrodes connected to first and second control terminals, respectively.

a first active power combiner means having a first input terminal directly connected to the first output terminal of the first active power divider means, a second input terminal coupled to a first auxiliary input port, and an output terminal, the first active power combiner means comprising first and second dual gate FETs each having source, drain, and first and second gate electrodes, the first gate electrode of the first FET in the first active power combiner means connected to the first input terminal of the first active power combiner means, the first gate electrode of the second FET in the first active power combiner means connected to the second input terminal of the first active power combiner means, the source electrodes of the first and second dual gate FETs being connected together and to a point of reference potential, the drain electrodes of the first and second dual gate FETs being connected together and to the output terminal of the first active power combiner means, and the second gate electrodes in the first active power combiner means connected to third and fourth control terminals, respectively;

a second active power divider means having an input terminal coupled to a second input port, a first output terminal, and a second output terminal coupled via a fourth circuit means to a second auxiliary output port, the second active power divider means comprising first and second dual gate FETs each having source, drain, and first and second gate electrodes, the first gate electrodes of the first and second dual gate FETs being connected together and to the input terminal of the second active power divider means, the source electrodes of the first and second dual gate FETs being connected together and to a point of reference potential, the drain electrode of the first FET in the second active power divider means connected to the first output terminal of the second active power divider means, the drain electrode of the second FET in the second active power divider means connected to the second output terminal of the second active power divider means, and the second gate electrodes in the second active power divider means connected to fifth and sixth control terminals, respectively;

a second active power combiner means having a first input terminal directly connected to the first output terminal of the second active power divider means, a second input terminal connected to the output terminal of the first active power combiner means, and an output terminal coupled to a first output port, the second active power combiner means comprising first and second dual gate FETs each having source, drain, and first and second gate electrodes, the first gate electrode of the first FET in the second active power combiner means connected to the first input terminal of the second active power combiner means, the first gate electrode of the second FET in the second active power combiner means connected to the second input terminal of the second active power combiner means, the source electrodes of the first and second dual gate FETs being connected together and to a point of reference potential, the drain electrodes of the first and second dual gate FETs being connected together and to the output terminal of the second active power combiner means, and the second gate electrodes in the second active power combiner means connected to seventh and eighth control terminals, respectively; and a control means for applying digital control signals to the first and second control terminals in the first active power divider means, the third and fourth control terminals in the first active power combiner means, the fifth and sixth control terminals in the second active power divider means, and the seventh and eighth control terminals in the second active power combiner means to selectively switch power from the first input port to the first output port and the first auxiliary output port, and to selectively switch power from the second input port to the first output port and the second auxiliary output port, and to selectively switch power from the first auxiliary input port to the first output port.

2. The switching apparatus of claim 1, in which the switching apparatus is a GaAs monolithic microwave integrated circuit.

3. The apparatus of claim 1, further comprising:
said third circuit means being a third active power divider means having an input terminal connected to the second output terminal of the first active power divider means, a first output terminal, and a second output terminal coupled to the first auxiliary output port, the third active power divider means comprising first and second dual gate FETs each having source, drain, and first and second gate electrodes, the first gate electrodes of the first and second dual gate FETs being connected together and to the input terminal of the third active power divider means, the source electrodes of the first and second dual gate FETs being connected together and to a point of reference potential, the drain electrode of the first FET in the third active power divider means connected to the first output terminal of the third active power divider means, the drain electrode of the second FET in the third active power divider means connected to the second output terminal of the third active power divider means, and the second gate electrodes in the third active power divider means connected to ninth and tenth control terminals, respectively;

a third active power combiner means having a first input terminal directly connected to the first output terminal of the third active power divider means, a second input terminal coupled to a second auxiliary input port, and an output terminal, the third active power combiner means comprising first and second dual gate FETs each having source, drain, and first and second gate electrodes, the first gate electrode of the first FET in the third active power combiner means connected to the first input terminal of the third active power combiner means, the first gate electrode of the second FET in the third active power combiner means connected to the second input terminal of the third active power combiner means, the source electrodes of the first and second dual gate FETs being connected together and to a point of reference potential, the drain electrodes of the first and second dual gate FETs being connected together and to the output terminal of the third active power combiner means, and the second gate electrodes in the third active power combiner means connected to eleventh and twelfth control terminals, respectively;

said fourth circuit means being a fourth active power divider means having an input terminal connected to the second output terminal of the second active power divider means, a first output terminal, and a second output terminal coupled to the second auxiliary output port, the fourth active power divider means comprising first and second dual gate FETs each having source, drain, and first and second gate electrodes, the first gate electrodes in the first and second dual gate FETs being connected together and to the input terminal of the fourth active power divider means, the source electrodes in the first and second dual gate FETs being connected together and to a point of reference potential, the drain electrode of the first FET in the fourth active power divider means connected to the first output terminal of the fourth active power divider means, the drain electrode of the second FET in the fourth active power divider means connected to the second output terminal of the fourth active power divider means, and the second gate electrodes in the fourth active power divider means connected to thirteenth and fourteenth control terminals, respectively;

a fourth active power combiner means having a first input terminal directly connected to the first output terminal of the fourth active power divider means, a second input terminal connected to the output terminal of the third active power combiner means, and an output terminal connected to a second output port, the fourth active power combiner means comprising first and second dual gate FETs each having source, drain, and first and second gate electrodes, the first gate electrode of the first FET in the fourth active power combiner means connected to the first input terminal of the forth active power combiner means, the first gate electrode of the second FET in the fourth active power combiner means connected to the second input terminal of the fourth active power combiner means, the source electrodes of the first and second dual gate FETs being connected together and to a point of reference potential, the drain electrodes of the first and second dual gate FETs being connected together and to the output terminal of the fourth active power combiner means, and the second gate electrodes in the fourth active power combiner means connected to fifteenth and sixteenth control terminals, respectively; and a control means for applying digital signals to the ninth and tenth control terminals in the third active power divider means, and the eleventh and twelfth control terminals in the third active power combiner means and to the thirteenth and fourteenth control terminals in the fourth active power divider means, and the fifteenth and sixteenth control terminals in the fourth active power combiner means to selectively switch power from the first input port to the second output port and the first auxiliary output port, and to selectively switch power from the second input port to the second output port and the second auxiliary output port, and to selectively switch power from the second auxiliary input port to the second output port.

4. The switching apparatus of claim 1, in which the dual gate FETs are MESFETs.

5. The switching apparatus of claim 1, in which the control signals applied to the third and fourth control terminals include positive potential signals to turn ON the first and second dual gate FETs, respectively, of the first active power combiner means and include negative potential signals to turn the first and second dual gate FETs OFF whereby the control signals can selectively turn the first and the second dual gate FETs ON and OFF independently of one another.

6. The apparatus of claim 1, further comprising:
an air bridge means for providing isolation between the first output terminal of the first active power divider means and the second input terminal of the first active power combiner means.

7. The switching apparatus of claim 1, in which the control signals applied to the first and second control terminals include positive potential signals to turn ON the first and second dual gate FETs, respectively, of the first active power divider means and include negative potential signals to turn the first and second dual gate FETs OFF whereby the control signals can selectively turn the first and the second dual gate FETs ON and OFF independently of one another.

8. A digitally controlled apparatus for selectively directing power from at least one input port and at least one auxiliary input port to at least one output port and at least one auxiliary output port, comprising:

a first active power divider means having an input terminal connected to a first input port, a first output terminal, and a second output terminal, the first active power divider means comprising first and second dual gate FETs each having source, drain and first and second gate electrodes, the first gate electrodes of the first and second dual gate FETs being connected together and to the input terminal, the source electrodes of the first and second dual gate FETs being connected together and to a point of reference potential, the drain electrode of the first FET connected to the first output terminal, the drain electrode of the second FET connected to the second output terminal, and at least one of the second gate electrodes of each of the dual gate FETs connected to respective control terminals;

a first active power combiner means having a first input terminal directly connected to the first output terminal of the first active power divider means, a second input terminal coupled to a first auxiliary input port, and an output terminal coupled via a third circuit means to a first output port, the first active power combiner means comprising first and second dual gate FETs each having source, drain and first and second gate electrodes, the first gate electrode of the first FET in the first active power combiner means connected to the first input terminal of the second active power combiner means, the first gate electrode of the second FET in the first active power combiner means connected to the second input terminal of the first active power combiner means, the source electrodes of the first and second dual gate FETs being connected together and to a point of reference potential, the drain electrodes of the first and second dual gate FETs being connected together and to the output terminal of the first active power combiner means, and at least one of the second gate electrodes of each of the dual gate FETs in the first active power combiner means connected to respective control terminals;

a second active power divider means having an input terminal connected to the second output terminal of the first active power divider means, a first output terminal, and a second output terminal coupled to a first auxiliary output port, the second active power divider means comprising first and second dual gate FETs each having source, drain and first and second gate electrodes, the first gate electrodes of the first and second dual gate FETs being connected together and to the input terminal of the second active power divider means, the source electrodes of the first and second dual gate FETs being connected together and to a point of reference potential, the drain electrode of the first FET in the second active power divider means connected to the first output terminal of the second active power divider means, the drain electrode of the second FET in the second active power divider means connected to the second output terminal of the second active power divider means, and at least one of the second gate electrodes in the second active power divider means connected to respective control terminals;

a second active power combiner means having a first input terminal directly connected to the first output terminal of the second active power divider means, a second input terminal coupled to a second auxiliary input port, and an output terminal coupled via a fourth circuit means to a second output port, the second active power combiner means comprising first and second dual gate FETs each having source, drain and first and second gate electrodes, the first gate electrode of the first FET in the second active power combiner means connected to the first input terminal of the second active power combiner means, the first gate electrode of the second FET in the second active power combiner means connected to the second input terminal of the second active power combiner means, the source electrodes of the first and second dual gate FETs being connected together and to a point of reference potential, the drain electrodes of the first and second dual gate FETs being connected together and to the output terminal of the second active power combiner means, and at least one of the second gate electrodes in the second active power combiner means connected to respective control terminals; and a control means for applying digital control signals to the control terminals of the first and second active power divider means and the first and second active power combiner means to selectively switch power from the first input port to the first and second output ports and the first auxiliary output port, and to selectively switch power from the first auxiliary input port to the first output port, and to selectively switch power from the second auxiliary input port to the second output port.

9. A digitally controlled switching apparatus for selectively directing power form at least one input port and at least one auxiliary input port to at least one output port and at least one auxiliary output port, comprising:

a first active power divider means having an input terminal connected to a first input port, a first output terminal, and a second output terminal, the first active power divider means comprising first and second dual gate FETs each having source, drain, and first and second gate electrodes, the first gate electrodes of the first and second dual gate FETs being connected together and to the input terminal, the source electrodes of the first and second dual gate FETs being connected together and to a point of reference potential, the drain electrode of the first FET connected to the first output terminal, the drain electrode of the second FET connected to the second output terminal, and the second gate electrodes connected to first and second control terminals, respectively;

a first active power combiner means having a first input terminal directly connected to the first output terminal of the first active power divider means, a second input terminal coupled to a first auxiliary input port, and an output terminal coupled via a third circuit means to a first output port, the first active power combiner means comprising first and second dual gate FETs each having source, drain, and first and second gate electrodes, the first gate electrode of the first FET in the first active power combiner means connected to the first input terminal of the first active power combiner means, the first gate electrode of the second FET in the first active power combiner means connected to the second input terminal of the first active power combiner means, the source electrodes of the first and second dual gate FETs being connected together and to a point of reference potential, the drain electrodes in the first and second dual gate FETs being connected together and to the output terminal of the first active power combiner means, and the second gate electrodes in the first active power combiner means connected to third and fourth control terminals, respectively;

a second active power divider means having an input terminal connected to the second output terminal of the first active power divider means, a first output terminal, and a second output terminal coupled to a first auxiliary output port, the second active power divider means comprising first and second dual gate FETs each having source, drain, and first and second gate electrodes, the first gate electrodes of the first and second dual gate FETs being connected together and to the input terminal of the second power divider means, the source electrodes of the first and second dual gate FETs being connected together and to a point of reference potential, the drain electrode of the first FET in the second active power divider means connected to the first output terminal of the second active power means, the drain electrode of the second FET in the second active power divider means connected to the second output terminal of the second active power divider means, and the second gate electrodes in the second active power divider means connected to fifth and sixth control terminals, respectively;

a second active power combiner means having a first input terminal directly connected to the first output terminal of the second active power divider means, a second input terminal coupled to a second auxiliary input port, and an output terminal coupled via a fourth circuit means to a second output port, the second active power combiner means comprising first and second dual gate FETs each having source, drain, and first and second gate electrodes, the first gate electrode of the first FET in the second active power combiner means connected to the first input terminal of the second active power combiner means, the first gate electrode of the second FET in the second active power combiner means connected to the second input terminal of the second active power combiner means, the source electrodes of the first and second dual gate FETs being connected together and to a point of reference potential, the drain electrodes of the first and second dual gate FETs being connected together and to the output terminal of the second active power combiner means, and the second gate electrodes in the second active power combiner means connected to seventh and eighth control terminals, respectively; and a control means for applying digital control signals to the first and second control terminals in the first active power divider means, the third and fourth control terminals in the first active power combiner means, the firth and sixth control terminals in the second active power divider means, and the seventh and eighth control terminals in the second active power combiner means to selectively switch power from the first input port to the first and second output ports and the first auxiliary port, and to selectively switch power from the first auxiliary input port to the first output port, and to selectively switch power form the second auxiliary input port to the second output port.

10. A digitally controlled switching apparatus for selectively directing power from at least one input port and at least one auxiliary input port to at least one output port and at least one auxiliary output port, comprising:

a first active power divider means having an input terminal connected to a first input port, a first output terminal, and a second output terminal coupled via a third circuit means to a first auxiliary output port, the first active power divider means comprising first and second dual gate FETs each having source, drain and first and second gate electrodes, the first gate electrodes of the first and second dual gate FETs being connected together and to the input terminal, the source electrodes of the first and second dual gate FETs being connected together and to a point of reference potential, the drain electrode of the first FET connected to the first output terminal, the drain electrode of the second FET connected to the second output terminal, and at least one of the second gate electrodes of each of the dual gate FETs connected to respective control terminals;

a first active power combiner means having a first input terminal directly connected to the first output terminal of the first active power divider means, a second input terminal coupled to a first auxiliary input port, and an output terminal, the first active power combiner means comprising first and second dual gate FETs each having source, drain and first and second gate electrodes, the first gate electrode of the first FET in the first active power combiner means connected to the first input terminal of the first active power combiner means, the first gate electrode of the second FET in the first active power combiner means connected to the second input terminal of the first active power combiner means, the source electrodes of the first and second dual gate FETs being connected together and to a point of reference potential, the drain electrodes in the first and second dual gate FETs being connected together and to the output terminal of the first active power combiner means, and at least one of the second gate electrodes of each of the dual gate FETs in the first active power combiner means connected to respective control terminals;

a second active power divider means having an input terminal coupled to a second input port, a first output terminal, and a second output terminal coupled via a fourth circuit means to a second auxiliary output port, the second active power divider means comprising first and second dual gate FETs each having source, drain, and first and second gate electrodes, the first gate electrodes of the first and second dual gate FETs being connected together and to the input terminal of the second active power divider means, the source electrodes of the first and second dual gate FETs being connected together and to a point of reference potential, the drain electrode of the first FET in the second active power divider means connected to the first output terminal of the second active power divider mean, the drain electrode of the second FET in the second active power divider means connected to the second output terminal of the second active power divider means, and at least one of the second gate electrodes in each of the dual gate FETs in the second active power divider means connected to respective control terminals;

a second active power combiner means having a first input terminal directly connected to the first output terminal of the second active power divider means, a second input terminal connected to the output terminal of the first active power combiner means, and an output terminal coupled to a first output port, the second active power combiner means comprising first and second dual gate FETs each having source, drain, and first and second gate electrodes, the first gate electrode of the first FET in the second active power combiner means connected to the first input terminal of the second active power combiner means, the first gate electrode of the second FET in the second active power combiner means connected to the second input terminal of the second active power combiner means, the source electrodes of the first and second dual gate FETs being connected together and to a point of reference potential, the drain electrodes of the first and second dual gate FETs being connected together and to the output terminal of the second active power combiner means, and at least one of the second gate electrodes in each of the dual gate FETs in the second active power combiner means connected to respective control terminals; and a control means for applying digital control signals to the control terminals of the first and second active power divider means and the first and second active power combiner means to selectively switch power from the first input port to the first output port and the first auxiliary output port, and to selectively switch power from the second input port to the first output port and the second auxiliary output port, and to selectively switch power from the first auxiliary input port to the first output port.

11. The apparatus of claim 10, further comprising:

said third circuit means being a third active power divider means having an input terminal connected to the second output terminal of the first active power divider means, a first output terminal, and a second output terminal coupled to the first auxiliary output port, the third active power divider means comprising first and second dual gate FETs each having source, drain and first and second gate electrodes, the first gate electrodes of the first and second dual gate FETs being connected together and to the input terminal of the third active power divider means, the source electrodes of the first and second dual gate FETs being connected together and to a point of reference potential, the drain electrode of the first FET in the third active power divider means connected o the first output terminal of the third active power divider means, the drain electrode of the second FET in the third active power divider means connected to the second output terminal of the third active power divider means, and at least one of the second gate electrodes in each of the dual gate FETs in the third active power divider means connected to respective control terminals;

a third active power combiner means having a first input terminal directly connected to the first output terminal of the third active power divider means, a second input terminal coupled to a second auxiliary input port, and an output terminal, the third active power combiner means comprising first and second dual gate FETs each having source, drain and first and second gate electrodes, the first gate electrode of the first FET in the third active power combiner means connected to the first input terminal of the third active power combiner means, the first gate electrode of the second FET in the third active power combiner means connected to the second input terminal of the third active power combiner means, the source electrodes of the first and second dual gate FETs being connected together and to a point of reference potential, the drain electrodes of the first and second dual gate FETs being connected together and to the output terminal of the third active power combiner means, and at least one of the second gate electrodes in the dual gate FETs in the third active power combiner means connected to respective control terminals;

said fourth circuit means being a fourth active power divider means having an input terminal connected to the second output terminal of the second active power divider means, a first output terminal, and a second output terminal coupled to the second auxiliary output port, the fourth active power divider means comprising first and second dual gate FETs each having source, drain and first and second gate electrodes, the first gate electrodes in the first and second dual gate FETs being connected together and to the input terminal of the fourth active power divider means, the source electrodes in the first and second dual gate FETs being connected together and to a point of reference potential, the drain electrode of the first FET in the fourth active power divider means connected to the first output terminal of the fourth active power divider means, the drain electrode of the second FET in the fourth active power divider means connected to the second output terminal of the fourth active power divider means, and at least one of the second gate electrodes in each of the dual gate FETs in the fourth active power divider means connected to respective control terminals;

a fourth active power combiner means having a first input terminal directly connected to the first output terminal of the fourth active power divider means, a second input terminal connected to the output terminal of the third active power combiner means, and an output terminal connected to a second output port, the fourth active power combiner means comprising first and second dual gate FETs each having source, drain and first and second gate electrodes, the first gate electrode of the first FET in the fourth active power combiner means connected to the first input terminal of the fourth active power combiner means, the first gate electrode of the second FET in the fourth active power combiner means connected to the second input terminal of the fourth active power combiner means, the source electrodes of the first and second dual gate FETs being connected together and to a point of reference potential, the drain electrodes of the first and second dual gate FETs being connected together and to the output terminal of the fourth active power combiner means, and t last one of the second gate electrodes in each of the dual gate FETs in the fourth active power combiner means connected to respective control terminals; and a control means for applying digital control signals to the control terminals in the third and fourth active power divider means and the third and fourth active power combiner means to selectively switch power from the first input port to the second output port and the first auxiliary output port, and to selectively switch power from the second input port to the second output port and the second auxiliary output port, and to selectively switch power from the second auxiliary input port to the second output port.

* * * * *